(12) United States Patent
Herner et al.

(10) Patent No.: US 7,816,659 B2
(45) Date of Patent: Oct. 19, 2010

(54) DEVICES HAVING REVERSIBLE RESISTIVITY-SWITCHING METAL OXIDE OR NITRIDE LAYER WITH ADDED METAL

(75) Inventors: S. Brad Herner, San Jose, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/287,452

(22) Filed: Nov. 23, 2005

(65) Prior Publication Data

US 2007/0114508 A1    May 24, 2007

(51) Int. Cl.
*H01L 29/02*    (2006.01)

(52) U.S. Cl. .................. 257/2; 257/3; 257/4; 257/5; 257/E29.002; 438/102; 438/103; 365/163

(58) Field of Classification Search ............... 257/1–5, 257/E29.002; 438/800, 900, 102–103; 365/163
See application file for complete search history.

(56) References Cited

U.S. PATENT DOCUMENTS

| | | | |
|---|---|---|---|
| 2,655,609 A * | 10/1953 | Shockley | 327/214 |
| 3,796,926 A * | 3/1974 | Cole et al. | 257/4 |
| 4,204,028 A | 5/1980 | Donley | |
| 4,499,557 A | 2/1985 | Holmberg et al. | |
| 4,646,266 A | 2/1987 | Ovshinsky et al. | |
| 4,907,054 A | 3/1990 | Berger | |
| 4,940,553 A | 7/1990 | von Benda | |
| 5,037,200 A * | 8/1991 | Kodama | 356/252 |
| 5,166,758 A | 11/1992 | Ovshinsky et al. | |
| 5,273,915 A | 12/1993 | Hwang et al. | |
| 5,311,055 A | 5/1994 | Goodman et al. | |
| 5,774,394 A | 6/1998 | Chen et al. | |

(Continued)

FOREIGN PATENT DOCUMENTS

EP    1 308 960 A2    5/2003

(Continued)

OTHER PUBLICATIONS

Seo et al. (Applied Physics letters, 86, 093509 (2005)) "Conductivity switching characteristics and reset currents in NiO films".).*

(Continued)

*Primary Examiner*—Thanh V Pham
*Assistant Examiner*—Jami M Valentine
(74) *Attorney, Agent, or Firm*—Dugan & Dugan, PC (57) ABSTRACT

A layer of resistivity-switching metal oxide or nitride can attain at least two stable resistivity states. Such a layer may be used in a state-change element in a nonvolatile memory cell, storing its data state, for example a "0" or a "1", in this resistivity state. Including additional metal atoms in a layer of such a resistivity-switching metal oxide or nitride compound decreases the current required to cause switching between resistivity states, reducing power requirements for an array of memory cells storing data in the resistivity state of such a layer. In various embodiments a memory cell may include a layer of resistivity-switching metal oxide or nitride compound with added metal formed in series with another element, such as a diode or a transistor.

35 Claims, 4 Drawing Sheets

U.S. PATENT DOCUMENTS

| | | | |
|---|---|---|---|
| 5,854,102 | A | 12/1998 | Gonzalez et al. |
| 5,915,167 | A | 6/1999 | Leedy |
| 6,034,882 | A | 3/2000 | Johnson et al. |
| RE37,259 | E | 7/2001 | Ovshinsky |
| 6,369,431 | B1 | 4/2002 | Gonzalez et al. |
| 6,426,891 | B1 | 7/2002 | Katori |
| 6,483,734 | B1 | 11/2002 | Sharma et al. |
| 6,534,841 | B1 | 3/2003 | Van Brocklin et al. |
| 6,541,792 | B1 | 4/2003 | Tran et al. |
| 6,707,698 | B2 | 3/2004 | Fricke et al. |
| 6,753,561 | B1 | 6/2004 | Rinerson et al. |
| 6,761,985 | B2 * | 7/2004 | Windisch et al. ............ 428/699 |
| 6,774,458 | B2 | 8/2004 | Fricke et al. |
| 6,778,441 | B2 | 8/2004 | Forbes et al. |
| 6,787,401 | B2 | 9/2004 | Gonzalez et al. |
| 6,798,685 | B2 | 9/2004 | Rinerson et al. |
| 6,815,744 | B1 | 11/2004 | Beck et al. |
| 6,831,854 | B2 | 12/2004 | Rinerson et al. |
| 6,834,008 | B2 | 12/2004 | Rinerson et al. |
| 6,836,421 | B2 | 12/2004 | Rinerson et al. |
| 6,850,429 | B2 | 2/2005 | Rinerson et al. |
| 6,850,455 | B2 | 2/2005 | Rinerson et al. |
| 6,856,536 | B2 | 2/2005 | Rinerson et al. |
| 6,859,382 | B2 | 2/2005 | Rinerson et al. |
| 6,870,755 | B2 | 3/2005 | Rinerson et al. |
| 6,946,719 | B2 | 9/2005 | Petti et al. |
| 6,952,030 | B2 | 10/2005 | Herner et al. |
| 7,116,573 | B2 | 10/2006 | Sakamoto et al. |
| 7,172,840 | B2 | 2/2007 | Chen et al. |
| 7,176,064 | B2 | 2/2007 | Herner et al. |
| 7,215,564 | B2 | 5/2007 | Happ et al. |
| 7,224,013 | B2 | 5/2007 | Herner et al. |
| 7,285,464 | B2 | 10/2007 | Herner |
| 7,307,013 | B2 | 12/2007 | Raghuram et al. |
| 7,307,268 | B2 | 12/2007 | Scheuerlein |
| 7,391,064 | B1 | 6/2008 | Tripsas et al. |
| 7,501,331 | B2 | 3/2009 | Herner |
| 2002/0057594 | A1 | 5/2002 | Hirai |
| 2003/0013007 | A1 * | 1/2003 | Kaun ...................... 429/94 |
| 2003/0081446 | A1 | 5/2003 | Fricke et al. |
| 2004/0002186 | A1 | 1/2004 | Vyvoda et al. |
| 2004/0095300 | A1 | 5/2004 | So et al. |
| 2004/0159828 | A1 | 8/2004 | Rinerson et al. |
| 2004/0159867 | A1 * | 8/2004 | Kinney et al. ............ 257/295 |
| 2004/0159869 | A1 | 8/2004 | Rinerson et al. |
| 2004/0160798 | A1 | 8/2004 | Rinerson et al. |
| 2004/0160806 | A1 | 8/2004 | Rinerson et al. |
| 2004/0160812 | A1 | 8/2004 | Rinerson et al. |
| 2004/0160819 | A1 | 8/2004 | Rinerson et al. |
| 2004/0161888 | A1 | 8/2004 | Rinerson et al. |
| 2004/0228172 | A1 | 11/2004 | Rinerson et al. |
| 2004/0245557 | A1 * | 12/2004 | Seo et al. .................... 257/298 |
| 2005/0052915 | A1 | 3/2005 | Herner |
| 2005/0167699 | A1 | 8/2005 | Sugita |
| 2005/0221200 | A1 | 10/2005 | Chen et al. |
| 2005/0226067 | A1 | 10/2005 | Herner |
| 2005/0247921 | A1 | 11/2005 | Lee et al. |
| 2005/0286211 | A1 | 12/2005 | Pinnow et al. |
| 2006/0006495 | A1 | 1/2006 | Herner et al. |
| 2006/0067117 | A1 | 3/2006 | Petti |
| 2006/0098472 | A1 | 5/2006 | Ahn et al. |
| 2006/0128153 | A1 | 6/2006 | Dunton et al. |
| 2006/0157679 | A1 * | 7/2006 | Scheuerlein .................... 257/2 |
| 2006/0249753 | A1 | 11/2006 | Herner |
| 2006/0250836 | A1 * | 11/2006 | Herner et al. ............ 365/148 |
| 2006/0250837 | A1 | 11/2006 | Herner et al. |
| 2007/0010100 | A1 | 1/2007 | Raghuram et al. |
| 2007/0072360 | A1 | 3/2007 | Kumar et al. |
| 2007/0102724 | A1 | 5/2007 | Kumar et al. |
| 2007/0114509 | A1 | 5/2007 | Herner |
| 2007/0228354 | A1 | 10/2007 | Scheuerlein |
| 2007/0228414 | A1 | 10/2007 | Kumar et al. |
| 2007/0236981 | A1 | 10/2007 | Herner |
| 2007/0246743 | A1 | 10/2007 | Cho et al. |
| 2008/0175032 | A1 | 7/2008 | Tanaka et al. |
| 2009/0001342 | A1 | 1/2009 | Schricker et al. |
| 2009/0001343 | A1 | 1/2009 | Schricker et al. |
| 2009/0001344 | A1 | 1/2009 | Schricker et al. |
| 2009/0001345 | A1 | 1/2009 | Schricker et al. |
| 2009/0104756 | A1 | 4/2009 | Kumar |

FOREIGN PATENT DOCUMENTS

| | | |
|---|---|---|
| EP | 1 484 799 A2 | 12/2004 |
| EP | 1484799 | 12/2004 |
| EP | 1 513 159 | 3/2005 |
| EP | 1 914 806 A | 4/2008 |
| GB | 1 284 645 A | 8/1972 |
| GB | 1416644 | 12/1975 |
| JP | 62042582 | 2/1987 |
| WO | WO 97/41606 | 11/1997 |
| WO | 0049659 | 8/2000 |
| WO | WO 00/49659 | 8/2000 |
| WO | WO 01/69655 A2 | 9/2001 |
| WO | WO 03/079463 A2 | 9/2003 |
| WO | WO 2004/084229 A | 9/2004 |
| WO | WO 2005/008783 A | 1/2005 |
| WO | WO 2005/024839 A | 3/2005 |
| WO | WO 2006/078505 A2 | 7/2006 |
| WO | WO 2006/121837 A2 | 11/2006 |
| WO | WO 2006/121837 A3 | 11/2006 |
| WO | WO 2007/004843 | 1/2007 |
| WO | WO 2007/018026 A | 2/2007 |
| WO | WO 2007/038709 | 4/2007 |
| WO | WO 2007/062022 A | 5/2007 |
| WO | WO 2007/072308 A | 6/2007 |

OTHER PUBLICATIONS

Roginskaya et al. ("Characterization of Bulk and Surface composition of CoxNi1-xOy Mixed Oxides for Electrocatalyis," Langmuir, vol. 13, No. 17, 1997, pp. 4621-4627).*

Bruyere et al. is provided as a teaching reference (Applied Physics Letters, vol. 16, No. 1, Jan. 1970, pp. 40-43)).*

Roginskaya et al. ("Characterization of Bulk and Surface composition of CoxNi1-xOy Mixed Oxides for Electrocatalysis," Langmuir, vol. 13, No. 17, 1997, pp. 4621-4627).*

Seo et al. (Applied Physics letters, 86, 093509 (2005)) "Conductivity switching characteristics and reset currents in NiO films".).*

Bruyere et al. (Applied Physics Letters, vol. 16, No. 1, Jan. 1970, pp. 40-43)).*

Sim et al. ("Resistance-switching Characteristics of polycrystalline Nb2O5 for nonvolatile memory application" IEEE Electron Device Letters vol. 26, issue 3, pp. 292-294, (2005) published May 2, 2005).*

U.S. Appl. No. 11/125,939, filed May 9, 2005, Herner et al.

U.S. Appl. No. 11/143,269, filed Jun. 2, 2005, Petti.

Baek, I.G., et al., "Highly Scalable Non-volatile Resistive Memory Using Simple Binary Oxide Driven By Asymmetric Unipolar Voltage Pulses", *IEDM* (2004), (Jan. 2004), 587-590.

Pagnia, H., et al., "Bistable switching in Electroformed Metal-Insulator-Metal Devices", *Phys. Stat. Sol.* A 108, 11 (1988), (1988), 10-65.

Park, Jae-Wan., et al. , "Reproducible resistive switching in nonstoichiometric nickel oxide films grown by rf reactive sputtering for resistive random access memory applications", *J. Vac. Sci. Technol*. A 23(5), (Sep./Oct. 2005), 1309-1313.

Seo, S., et al., "Conductivity switching characteristics and reset currents in NiO films", *Appl. Phys. Lett.* 86, 093509 (2005), (2005), 093509;093509-2;093509-3.

Seo, S., et al., "Reproducible resistance switching in polycrystalline NiO films", *Appl. Phys. Lett.* vol. 85, No. 23 (2004), (Dec. 6, 2004), 5655-5657.

Sim, H., et al., "Resistance-switching characteristics of polycrystalline Nb2O5 for nonvolatile memory application", *IEEE Electron Device Letters* 26, 292, (2005), 1-3.

Windisch, et al., "Synthesis and characterization of transparent conducting oxide cobalt-nickel spinel films," Journal of Vacuum Science & Technology A, vol. 19, No. 4, Jul. 2001 pp. 1647-1651.

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

Beck, et al., "Reproducible Switching Effect in Thin Oxide Films for Memory Applications," Applied Physics Letters, vol. 77, No. 1, Jul. 3, 2000, pp. 139-141, XP00958527, ISSN: 0003-6951.

The Institution of Electrical Engineers, Stevenage, GB; 2006, Prince B: "Trends in Scaled and Nanotechnology Memories" XP002446652 Database Accession No. 9084874.

International Search Report of International Application No. PCT/US2006/045017 (SD-MA-165-1-PCT) dated Apr. 12, 2007.

International Preliminary Report on Patentability and Written Opinion of International Application No. PCT/US2006/045017 (SD-MA-165-1-PCT) dated May 27, 2008.

Hiatt et al., "Bistable Switching in Niobium Oxide Diodes," Applied Physics Letters, Mar. 15, 1965, vol. 6, No. 6, pp. 106-108.

Scheuerlein et al., "A 10ns Read and Write Non-Volatile Memory Array Using a Magnetic Tunnel Junction and FET Switch in each Cell," 2000, IEEE International Solid-State Circuits Conference, pp. 1-2.

Ozgur et al., "A comprehensive review of ZnO materials and devices," Journal of Applied Physics, 2005, pp. 1-103, 98, America Institute of Physics.

Baek et al., "Multi-layer Cross-point Binary Oxide Resistive Memory (OxRRAM) for Post-NAND Storage Application," 2005, pp. 1-4, IEEE.

Hwang et al., "Molecular dynamics simulations of nanomemory element based on boron-nitride nanotube-to-peapod transition," Computational Materials Science, 2005, pp. 317-324, 33, Elsevier B.V.

Jeong et al., "Ultraviolet-enhanced photodiode employing n-ZnO/p-Si structure," Applied Physics Letters, Oct. 6, 2003, pp. 2946-2948, vol. 83, No. 14, American Institute of Physics.

Sim et al., "Excellent Resistance Switching Characteristics of Pt/SrTiO3 Schottky Junction for Multi-bit Nonvolatile Memory Application," 2005, pp. 1-4, IEEE.

Prince, "Trends in Scaled and Nanotechnology Memories," 2005, pp. 55-61, IEEE.

Dec. 26, 2006 Office Action of U.S. Appl. No. 11/125,939 (SD-MA-146).

May 9, 2007 International Search Report of International Application No. PCT/US2006/045034 (SD-MA-165-PCT).

May 9, 2007 Written Opinion of International Application No. PCT/US2006/045034 (SD-MA-165-PCT).

Jan. 8, 2008 Office Action of U.S. Appl. No. 11/395,995 (SD-MA-146-1).

May 27, 2008 International Preliminary Report on Patentability of International Application No. PCT/US2006/045034 (SD-MA-165-PCT).

Jun. 13, 2008 Office Action of U.S. Appl. No. 11/394,903 (SD-MA-169).

Jul. 2, 2008 Office Action of U.S. Appl. No. 11/395,995 (SD-MA-146-1).

Sep. 4, 2008 Office Action of U.S. Appl. No. 11/440,899 (SD-MA-165-1).

Sep. 18, 2008 Office Action of European Application No. 06 838 165.6 (SD-MA-165-PCT-EPC).

Jan. 15, 2009 Office Action of U.S. Appl. No. 11/395,421 (SD-MA-168).

Jan. 16, 2009 Office Action of U.S. Appl. No. 11/395,419 (SD-MXA-170).

Mar. 10, 2009 Office Action and Search Report of ROC (Taiwan) Patent Application No. 095143253.

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

Jeong et al., "Ultraviolet-enhanced photodiode employing n-ZnO/p-Si structure", Applied Physics Letters, American Institute of Physics, Melville, NY, US, vol. 83, No. 14, Oct. 6, 2003, pp. 2946-2948.

Ozgur et al., "A comprehensive review of ZnO materials and devices", Journal of Applied Physics, American Institute of Physics, New York, US, vol. 98, No. 4, Aug. 30, 2005, pp. 1-103.

Sim et al., "Excellent Resistance Switching Characteristics of Pt/SrTiO3 Schottky Junction for Multi-bit Nonvolatile Memory Application", Electron Devices Meeting, 2005, IEDMTechnical Digest, IEEE International Dec. 5, 2005, Piscataway, NJ, USA, pp. 758-761.

Aug. 4, 2008 Preliminary Amendment of European Patent Application No. 06 838 165.6.

Office Action of U.S. Appl. No. 11/440,899 mailed Sep. 4, 2008.

May 8, 2009 Office Action of Chinese Application No. 200680043939.X.

Jun. 17, 2009 Reply to Mar. 17, 2009 Final Office Action of U.S. Appl. No. 11/440,899.

Office Action of U.S. Appl. No. 11/440,899 mailed Aug. 13, 2009.

Office Action of China Patent Application No. 200680043951.0 dated Jul. 3, 2009.

Jan. 5, 2009 Reply to Sep. 4, 2008 Office Action of U.S. Appl. No. 11/440,899.

Jun. 8, 2009 Reply to Mar. 10, 2009 Office Action of Taiwan Patent Application No. 095143253.

Oct. 28, 2009 Reply to Office Action of related Chinese Patent Application No. 200680043951.0 dated Jul. 30, 2009.

Sep. 8, 2009 Reply to Office Action of counterpart Chinese Patent Application No. 200680043939.X May 8, 2009.

Nov. 11, 2009 Reply to Aug. 13, 2009 Office Action of related U.S. Appl. No. 11/440,899.

Office Action of related U.S. Appl. No. 11/440,899 mailed Feb. 18, 2010.

Second Office Action of China Patent Application No. 200680043951.0 dated Apr. 21, 2010.

May 17, 2010 Reply to Feb. 18, 2010 Final Office Action of U.S. Appl. No. 11/440,899.

Office Action of U.S. Appl. No. 11/440,899 dated May 25, 2010.

Jun. 2, 2010 Reply to Apr. 21, 2010 Second Office Action of China Patent Application No. 200680043951.

Jun. 21, 2010 Reply to May 25, 2010 Office Action of U.S. Appl. No. 11/440,899.

Notice of Allowance of U.S. Appl. No. 11/440,899 mailed Jul. 9, 2010.

\* cited by examiner

DEVICES HAVING REVERSIBLE RESISTIVITY-SWITCHING METAL OXIDE OR NITRIDE LAYER WITH ADDED METAL

BACKGROUND OF THE INVENTION

The invention relates to a resistivity-switching material that can be used to store a data state in a nonvolatile memory cell.

Resistivity-switching materials, which can reversibly be converted between higher and lower resistivity states, are known. Switching may be induced by subjecting the resistivity-switching material to a voltage or current, which may be relatively large. These two or more stable resistivity states make such materials an attractive option for use in a rewriteable non-volatile memory array. In a memory array based on such resistivity-switching material, it is generally advantageous to reduce power requirements.

There is a need, therefore, to reduce the voltage, current, or switching time required to switch these resistivity-switching materials between stable resistivity states.

SUMMARY OF THE PREFERRED EMBODIMENTS

The present invention is defined by the following claims, and nothing in this section should be taken as a limitation on those claims. In general, the invention is directed to resistivity-switching metal oxides or nitrides.

A first aspect of the invention provides for a semiconductor device comprising: a reversible state-change element comprising a layer of a resistivity-switching metal oxide or nitride compound, the resistivity-switching metal oxide or nitride compound including only one metal, wherein the layer of resistivity-switching metal oxide or nitride compound includes a metal additive, wherein the metal additive is between about 0.01 and about 5 percent of the metal atoms in the layer of metal oxide or nitride compound.

Another aspect of the invention provides for a rewriteable nonvolatile memory cell comprising: a state-change element comprising a layer of resistivity-switching metal oxide or nitride compound, the resistivity-switching metal oxide or nitride compound including only one metal, wherein the layer of resistivity-switching metal oxide or nitride compound includes a metal additive, wherein the metal additive is between about 0.01 and about 5 percent of the metal atoms in the layer of metal oxide or nitride compound, wherein a data state of the memory cell is stored in a resistivity state of the layer of resistivity-switching metal oxide or nitride compound.

Yet another aspect of the invention provides for a method for forming a memory cell, the method comprising: forming a state-change element, the state-change element comprising a layer of resistivity-switching metal oxide or nitride compound, the resistivity-switching metal oxide or nitride compound including only one metal, wherein the layer of resistivity-switching metal oxide or nitride compound includes a metal additive, wherein the metal additive is between about 0.01 and about 5 percent of the metal atoms in the layer of metal oxide or nitride compound, wherein a data state of the memory cell corresponds to a resistivity state of the layer of resistivity-switching metal oxide or nitride compound.

A preferred embodiment of the invention provides for a monolithic three dimensional memory array comprising: a) a first memory level formed above a substrate, the first memory level comprising: a plurality of first reversible state-change elements, each state-change element comprising a layer of a resistivity-switching metal oxide or nitride compound, the resistivity-switching metal oxide or nitride compound including only one metal, wherein the layer of resistivity-switching metal oxide or nitride compound includes a metal additive, wherein the metal additive is between about 0.01 and about 5 percent of the metal atoms in the layer of metal oxide or nitride; and b) a second memory level monolithically formed above the first memory level.

Another preferred embodiment provides for a method for forming a first memory level, the method comprising: forming a plurality of substantially parallel, substantially coplanar bottom conductors above a substrate; forming a plurality of substantially parallel, substantially coplanar top conductors above the bottom conductors; forming a plurality of vertically oriented diodes, each diode disposed between one of the bottom conductors and one of the top conductors; forming a plurality of reversible state-change elements, each state-change element comprising a layer of a resistivity-switching metal oxide or nitride compound, the resistivity-switching metal oxide or nitride compound including only one metal, wherein the layer of resistivity-switching metal oxide or nitride compound includes a metal additive, wherein the metal additive is between about 0.01 and about 5 percent of the metal atoms in the layer of metal oxide or nitride compound, wherein each state-change element is disposed between one of the diodes and one of the top conductors or between one of the diodes and one of the bottom conductors.

Another aspect of the invention provides for a method for forming a nonvolatile memory cell comprising a reversible state-change element, the method comprising: forming a layer of a resistivity-switching metal oxide or nitride compound, the resistivity-switching metal oxide or nitride compound including only one metal, which is a first metal; and during or after the step of forming the layer of a resistivity-switching metal oxide or nitride compound, adding a second metal to the layer of resistivity-switching metal oxide or nitride compound, wherein the reversible state-change element comprises the layer of resistivity-switching metal oxide or nitride compound.

A preferred embodiment of the invention provides for a nonvolatile memory cell comprising: a state-change element comprising: a) a bottom contact layer consisting essentially of a first metal oxide or metal nitride compound, the first metal oxide or metal nitride compound including only one metal; b) a resistivity-switching layer consisting essentially of the first metal oxide or metal nitride compound and a metal additive, wherein the metal additive is between about 0.01 and about 5 percent of the metal atoms in the resistivity-switching layer; and c) a top contact layer consisting essentially of the first metal oxide or metal nitride compound, wherein the resistivity-switching layer is above and in contact with the bottom contact layer and the top contact layer is above and in contact with the resistivity-switching layer, wherein a data state of the memory cell is stored in a resistance state of the state-change element.

A related embodiment provides for a nonvolatile memory cell comprising: a state-change element comprising: a) a bottom contact layer consisting essentially of a first metal oxide or metal nitride compound and a metal additive, wherein the metal additive is between about 0.01 and about 5 percent of the metal atoms in the bottom contact layer and wherein the first metal oxide or metal nitride compound includes only one metal; b) a resistivity-switching layer consisting essentially of the first metal oxide or metal nitride compound; and c) a top contact layer consisting essentially of the first metal oxide or metal nitride compound and the metal additive, wherein the metal additive is between about 0.01 and about 5 percent of the metal atoms in the top contact layer, wherein the resistivity-switching layer is above and in contact with the bottom contact layer and the top contact layer is above and in contact with the resistivity-switching layer, wherein a data state of the memory cell is stored in a resistance state of the state-change element.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

A variety of materials show reversible resistivity-switching behavior. These materials include chalcogenides, carbon polymers, perovskites, and certain metal oxides and nitrides. Specifically, there are metal oxide and nitride compounds which include only one metal and exhibit reliable resistivity-switching behavior. This group includes NiO, $Nb_2O_5$, $TiO_2$, $HfO_2$, $Al_2O_3$, CoO, $MgO_x$, $CrO_2$, VO, BN, and AlN.

A layer of one of these materials may be formed in an initial state, for example a stable, relatively low-resistivity state. Upon application of sufficient voltage, the material switches to a stable high-resistivity state. (By applying different currents and voltages, more than two resistivity states may be achieved. For simplicity, this discussion will speak of high- and low-resistivity states, but it will be understood that more than two states are possible and may be useful.) This resistivity switching is reversible; subsequent application of appropriate current or voltage can serve to return the resistivity-switching material to a stable low-resistivity state. For some of these resistivity-switching materials, and in some environments, the set current (which switches the material from the high-resistivity state to the low-resistivity state) flows in one direction, while the reset current (which switches the material from the low-resistivity state to the high-resistivity state) must flow in the opposite direction. For other resistivity-switching materials, in other environments, the direction of set and reset current flow is unimportant.

The conversion from low-resistivity to high-resistivity can be reversed, and the cycle can be repeated many times. Depending on the material and the environment, the initial state may be high-resistivity rather than low-resistivity. When this discussion refers to "resistivity-switching material", "resistivity-switching metal oxide or nitride", "resistivity-switching memory element" or similar terms, it will be understood that a reversible resistivity-switching material is meant.

This resistivity-switching behavior makes these materials of interest for use in nonvolatile memory arrays. The resistivity state may store a data state of a memory cell; for example one resistivity state may correspond to a data "0", for example, while the other resistivity state corresponds to a data "1". As noted, in some materials more than two stable resistivity states may be achievable, allowing storage of more than two data states.

The actual conversion mechanism is not well-understood. Set and reset voltages are applied, but it is unclear if it is the applied voltage or current flow that actually causes the switch. In general set and reset voltages and currents must be relatively large. The resistivity state is sensed by applying a read voltage, which is smaller than either the set or reset voltage. For a given read voltage, current flow will be higher when the resistivity-switching material is in the low-resistivity state than when it is in the high-resistivity state.

In electronic devices it is frequently advantageous to reduce power requirements. In a memory array using resistivity-switching metal oxides or nitrides, power requirements are reduced by decreasing the set and reset voltages and currents.

It has been found that the set and reset voltages or currents that must be applied to induce resistivity switching can be reduced by introducing additional metal into a resistivity-switching metal oxide or nitride compound. Alternatively, resistivity switching may be achieved at the same set or reset voltage or current but in a shorter time.

It is most practical to use metals that are compatible with silicon processing; thus preferred metals to use as this additive include cobalt, aluminum, gallium, indium, nickel, niobium, zirconium, titanium, hafnium, tantalum, magnesium, chromium, vanadium, boron, yttrium, and lanthanum. Copper, iron, manganese, and zinc may have the desired properties, and may also be used, but are generally less compatible with silicon processing and are thus less preferred. The metal added to a metal oxide or nitride compound can either be the same as the metal of the compound, or different. Advantage may be gained either by adding extra nickel to a layer of NiO, for example, or by adding a different metal such as cobalt or aluminum to the NiO instead.

Note that the layer of resistivity-switching metal oxide or nitride is a binary compound having two component elements, like NiO, a compound of nickel and oxygen, or AlN, a compound of aluminum and nitrogen. Such a binary compound includes exactly one metal. In the present invention layer is formed in which the composition of the layer is predominantly one of these single-metal metal oxide or nitride compounds, and then extra atoms of another metal (or the same metal) are included in the layer. This is distinct from a layer formed of a more complex compound in which the compound itself has more than one metal; an example is a perovskite like $CaTiO_3$.

This discussion will speak of an oxide or nitride layer having an added metal or a metal additive. Other terms are commonly used to describe addition of a metal to a material. When a metal such as boron is added to silicon to enhance its conductivity, for example, the added boron is generally described as a dopant. A dopant normally appears in very low concentration; a typical dopant concentration is about $10^{19}$ dopant atoms/cm$^3$. A metal may also be added to another metal to form an alloy, in which two (or more) metals are combined in any ratio. To avoid any expectations of concentration that might come with the use of such terms, this discussion will opt for the more neutral terms "added metal" and "metal additive". In aspects of the invention, the added metal is a fairly small fraction of the completed resistivity-switching layer. Atoms of the added metal preferably are between about 0.01 and about 5 percent of the metal atoms present in the resistivity-switching layer.

The resistivity-switching metal oxides or nitrides can be formed by methods including sputtering, chemical vapor deposition (CVD), a form of CVD known as atomic layer deposition (ALD), electrodeposition, and evaporation. The metal additive can be introduced into the layer of the metal oxide or nitride compound by a variety of methods during or after formation of the layer. A few of the preferred methods to form a layer of a resistivity-switching oxide or nitride compound with a metal additive will be briefly described, but detailing all possible methods is impractical, and it will be understood by those skilled in the art that such resistivity-switching films with added metal formed by methods not specifically described here will still fall within the scope of the invention.

In some embodiments, the metal oxide or nitride layer is formed first by any conventional method, then is doped with the metal additive by ion implantation. For example, a NiO film can be formed, then implanted with cobalt or aluminum ions.

Alternatively, a small amount of the metal to be added can be provided by any appropriate method, such as ALD, above, below, adjacent to, or within the layer of metal oxide or nitride. The provided metal additive will then diffuse through the metal oxide or nitride layer.

Metal oxides and nitrides are often formed by reactive sputtering. To form NiO by this method, a nickel sputtering target is bombarded with a heavy inert ion such as argon and by $O_2$. The nickel and oxygen combine, forming NiO.

To form a metal oxide or nitride with a metal additive by sputtering, the metal to be added is included in the sputtering target in the desired proportion. For example, suppose a NiO layer is to be formed with cobalt as the metal additive, in which about 95 percent of the metal atoms in the deposited layer are to be nickel atoms and about 5 percent are to be cobalt. An alloy target having sputter material that is 95 at % nickel and 5 at % cobalt will provide these atoms in the desired proportion, and can be sputtered as usual by argon and $O_2$. In various embodiments the atoms of the metal additive can be between about 0.01 and about 5 percent of the metal atoms in the resistivity-switching metal oxide or nitride layer. If desired more than one metal additive can be included, though for simplicity this discussion will describe the use of one added metal.

Some of the metal oxide or nitride compounds listed can be deposited by CVD. In these cases some metal additives can be added by in situ inclusion. During CVD a precursor gas or gases are flowed under conditions that will cause the metal oxide or nitride to deposit on a substrate. An added metal is included in situ in a layer during CVD by simultaneously flowing a precursor gas which provides dopant atoms, in this case the metal additive, in the film as it forms. Suitable precursor gases are not available for all of the metal additives named, however. (It is known to add a conductivity-enhancing dopant to deposited silicon by in situ doping. As described, in aspects of the present invention the added metal is included in concentrations higher than those typical for a dopant; thus the process is here described as "in situ inclusion" rather than "in situ doping".)

Figure 1A:
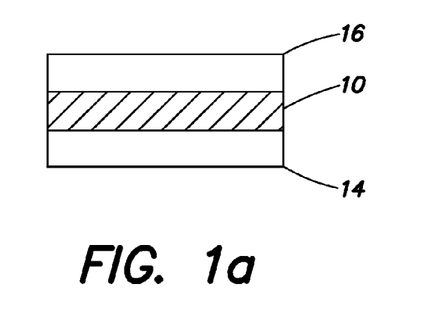
FIGS. 1a and 1b are cross-sectional views of compound stacks of a resistivity-switching layers and contact layers, the layers of metal oxide or nitride, one or more formed with and one or more formed without added metal, according to an embodiment of the present invention.

It may also be desirable to form the resistivity-switching metal oxide or nitride layer in a compound stack with variable composition. FIG. 1a shows a resistivity-switching metal oxide or nitride layer 10 which includes a metal additive, while contact layers 14 and 16, formed immediately below and above resistivity-switching layer 10, are formed of the same metal oxide or nitride but with no metal additive. For example, layer 10 may be NiO with included aluminum or cobalt, while layers 14 and 16 are NiO with no added aluminum or cobalt, or in which aluminum or cobalt atoms are less than 0.01 percent of the metal atoms in these layers. It is expected that contact layers 14 and 16 will provide an improved electrical contact for resistivity-switching layer 10, causing it to switch resistivity states at lower current or voltage than if contact layers 14 and 16 were not present. Contact layers 14 and 16 may or may not switch resistivity states as well.

Figure 1B:
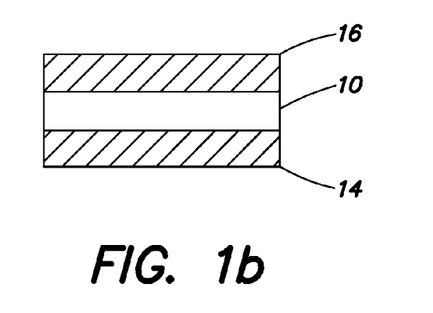

In an alternative embodiment shown in FIG. 1b, a compound stack may include layers 14, 10, and 16 of the same resistivity-switching metal oxide or nitride in which resistivity-switching layer 10 does not include a metal additive and contact layers 14 and 16 do.

Figure 2:
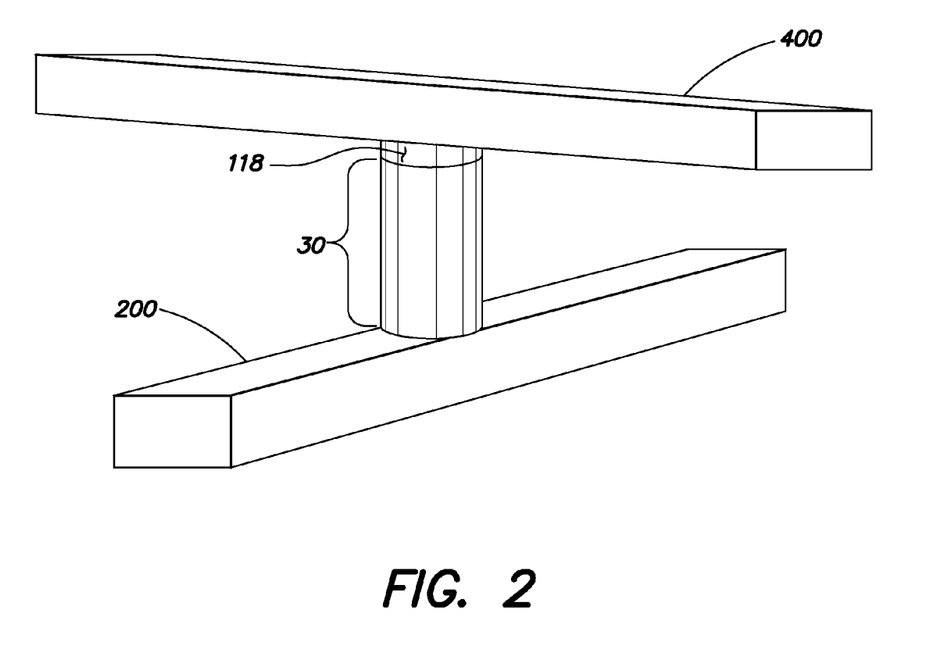
FIG. 2 is a perspective view of a nonvolatile memory cell including a diode and a resistance-switching element disposed in series between a top and a bottom conductor which may advantageously be modified to use aspects of the present invention.

In Herner et al., U.S. patent application Ser. No. 11/125, 939, "Rewriteable Memory Cell Comprising a Diode and a Resistance-Switching Material," filed May 9, 2005, hereinafter the '939 application and hereby incorporated by reference, a diode is paired with a resistivity-switching material to form a rewriteable nonvolatile memory cell that can be formed and programmed in a large, high-density array. An embodiment of the '939 application is shown in FIG. 2. The cell includes a portion of a bottom conductor 200 and a portion of a top conductor 400. The rail-shaped top and bottom conductors preferably extend in different directions; for example they may be perpendicular. Disposed between the top conductor 400 and bottom conductor 200 are a diode 30 and a resistance-switching element 118 arranged electrically in series. The resistance-switching element 118 comprises a layer of resistivity-switching material which is converted from the low-resistance state to the high-resistance state, or, alternatively, from the high-resistance state to the low-resistance state, upon application of voltage across or flow of current through the resistance-switching element 118. The conversion from low resistance to high resistance is reversible. (Note that this discussion speaks of both resistivity and resistance states. A material, such as nickel oxide, has a resistivity, while a discrete electrical element, such as a resistor, has a resistance.)

Figure 3:
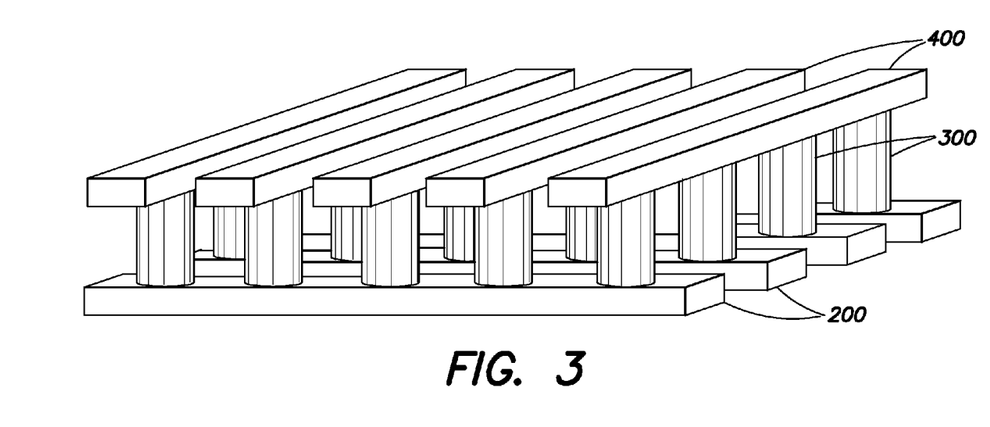
FIG. 3 is a perspective view of a portion of a memory level of memory cells like those of FIG. 2.

FIG. 3 shows a plurality of bottom conductors 200 and top conductors 400, with intervening pillars 300, the pillars 300 comprising diodes and resistance-switching elements. In an alternative embodiment, the diode could be replaced with some other non-ohmic device. In this way a first level of memory cells can be formed; only a small portion of such a memory level is shown here. In preferred embodiments, additional memory levels can be formed stacked above this first memory level, forming a highly dense monolithic three dimensional memory array. The memory array is formed of deposited and grown layers above a substrate, for example a monocrystalline silicon substrate. Support circuitry is advantageously formed in the substrate below the memory array.

Petti et al., U.S. patent application Ser. No. 11/143,269, "Rewriteable Memory Cell Comprising a Transistor and Resistance-Switching Material in Series," filed Jun. 2, 2005 and hereby incorporated by reference, describes a memory cell having a layer of this resistivity-switching material formed in series with a MOS transistor. In embodiments of Petti et al., the MOS transistor is a thin-film transistor, having its channel region in deposited semiconductor material rather than in a monocrystalline wafer substrate.

In either the '939 application or Petti et al., the resistivity-switching metal oxide or nitride can have metal added according to the present invention to reduce set and reset voltages or currents or reduce switching time, and thus reduce overall power consumption. A state-change element is an element that can attain a stable state which can reliably be sensed. A reversible state-change element can be reversibly switched between states. More generally, then, in any memory or any device in which a state-change element comprising one of the named resistivity-switching metal oxides or nitrides is used to store a resistivity state, whether as a data state for a memory cell or for some other use, that state-change element may benefit from the use of a metal additive to the metal oxide or nitride according to the present invention.

A detailed example will be provided of fabrication of a monolithic three dimensional memory array formed according to a preferred embodiment of the present invention. For clarity many details, including steps, materials, and process conditions, will be included. It will be understood that this example is non-limiting, and that these details can be modified, omitted, or augmented while the results fall within the scope of the invention.

The memory cell of Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, describes a memory cell including a diode formed of polycrystalline silicon (or polysilicon). The polysilicon of the diode is formed in a high-resistivity state and can be converted to a low-resistivity state. The data state of the cell is effectively stored in the resistivity state of the polysilicon.

As described in Herner et al., U.S. patent application Ser. No. 11/148,530, "Nonvolatile Memory Cell Operating by Increasing Order in Polycrystalline Semiconductor Material," filed Jun. 8, 2005, hereinafter the '530 application and hereby incorporated by reference, it is believed that when amorphous silicon is crystallized adjacent to certain silicides, the resulting polysilicon may be more highly ordered and thus more conductive than silicon crystallized with no adjacent silicide. It is believed that an adjacent layer of, for example, titanium silicide may have a lattice spacing and orientation which will provide a crystallization template for the silicon as it crystallizes, allowing it to crystallize with relatively few defects. In short, deposited silicon crystallized with no adjacent layer of titanium silicide will be relatively high in defects and high-resistivity as formed, while deposited silicon crystallized adjacent to a layer of titanium silicide will be lower in defects and low-resistivity as formed. High-defect, high-resistivity polysilicon can have its order increased by programming, converting it to low-resistivity polysilicon; these two states can correspond to data states and can be the basis of a memory cell. Low-defect polysilicon is low-resistivity as formed, and thus cannot the basis of a memory cell using this mechanism.

In the memory to be described, a memory cell will pair a resistivity-switching metal oxide or nitride layer (having added metal) with a polysilicon diode. The resistivity-switching metal oxide or nitride layer will store the data state; thus there is no need for the polysilicon of the diode to store this state as well, or for the large voltage required to convert it to a low-resistivity state. In the memory to be described, then, it may be preferred that the polysilicon of the polysilicon diode be formed in a low-resistivity state, with an adjacent silicide.

Herner et al., U.S. Pat. No. 6,952,030, "High-Density Three-Dimensional Memory Cell," teaches a monolithic three dimensional memory array comprising memory cells, wherein each memory cell is a one-time programmable cell. The cell is formed in a high-resistance state, and, upon application of a programming voltage, is permanently converted to a low-resistance state. Related memory arrays are taught in Herner et al., U.S. patent application Ser. No. 11/015,824, "Nonvolatile Memory Cell Comprising a Reduced Height Vertical Diode," filed Dec. 17, 2004; in Herner et al., U.S. patent application Ser. No. 11/125,606, "High-Density Nonvolatile Memory Array Fabricated at Low Temperature Comprising Semiconductor Diodes," filed May 9, 2005; and in Herner et al., U.S. patent application Ser. No. 10/954,577, "Junction Diode Comprising Varying Semiconductor Compositions," filed Sep. 29, 2004, all hereby incorporated by reference. Teachings of the '939 application, of Petti et al., and of the other incorporated applications and patents will be useful in formation of a memory array according to the present invention. To avoid obscuring the invention, not all of the details of the incorporated applications and patents will be included, but it will be understood that no teaching of these applications or patents is intended to be excluded.

EXAMPLE

Figure 4A:
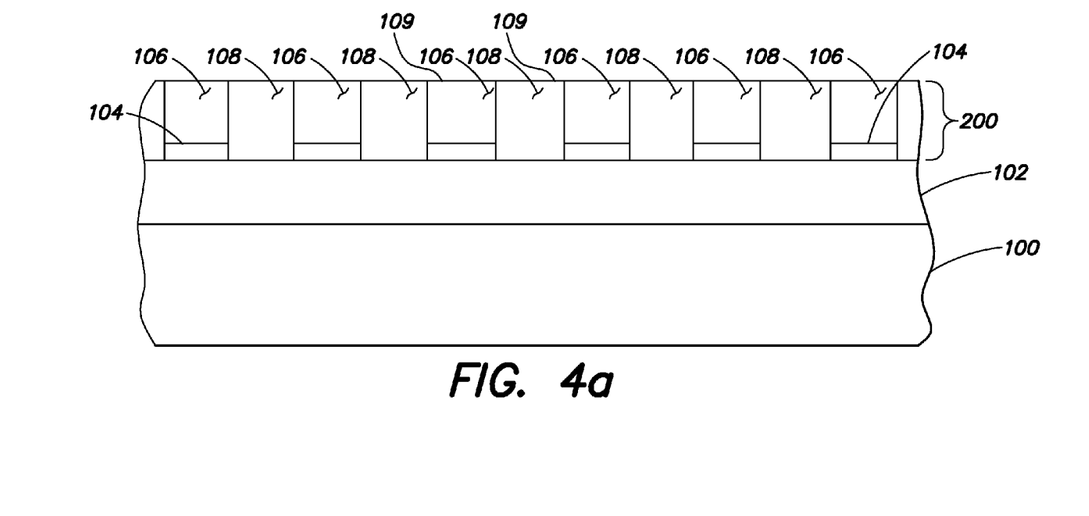
FIGS. 4a-4c are cross-sectional views illustrating stages in fabrication of a memory level of nonvolatile memory cells formed according to an embodiment of the present invention.

Turning to FIG. 4a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. An adhesion layer 104 may be included between the insulating layer 102 and the conducting layer 106 to help the conducting layer 106 adhere. A preferred material for the adhesion layer 104 is titanium nitride, though other materials may be used, or this layer may be omitted. Adhesion layer 104 can be deposited by any conventional method, for example by sputtering.

The next layer to be deposited is conducting layer 106. Conducting layer 106 can comprise any conducting material known in the art, such as doped semiconductor, metals such as tungsten, or metal alloys or compounds.

Once all the layers that will form the conductor rails have been deposited, the layers will be patterned and etched using any suitable masking and etching process to form substantially parallel, substantially coplanar conductors 200, shown in FIG. 4a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition (CVD), or, for example, high-density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 4a. This removal of dielectric overfill to form planar surface 109 can be performed by any process known in the art, such as etchback or chemical mechanical polishing (CMP). For example, the etchback techniques described in Raghuram et al., U.S. application Ser. No. 10/883,417, "Nonselective Unpatterned Etchback to Expose Buried Patterned Features," filed Jun. 30, 2004 and hereby incorporated by reference in its entirety, can advantageously be used. Alternatively, conductor rails can be formed by a Damascene process, in which oxide is deposited, trenches are etched in the oxide, then the trenches are filled with conductive material and overfill removed to create the conductor rails.

Figure 4B:
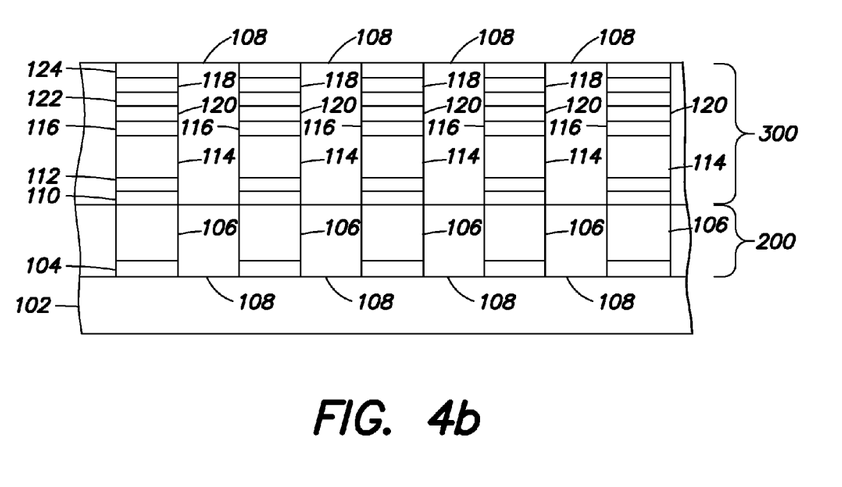

Next, turning to FIG. 4b, vertical pillars will be formed above completed conductor rails 200. (To save space substrate 100 is omitted in FIG. 4b and subsequent figures; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer 110 is titanium nitride, it can be deposited in the same manner as the adhesion layer described earlier.

Next semiconductor material that will be patterned into pillars is deposited. Any suitable semiconductor material or semiconductor alloy can be used. Silicon is preferred.

The term junction diode is used herein to refer to a semiconductor device with the property of non-ohmic conduction, having two terminal electrodes, and made of semiconducting material which is p-type at one electrode and n-type at the other. In preferred embodiments, the semiconductor pillar comprises a junction diode, the junction diode comprising a bottom heavily doped region of a first conductivity type and a top heavily doped region of a second conductivity type. The middle region, between the top and bottom regions, is an intrinsic or lightly doped region of either the first or second conductivity type.

In this example, bottom heavily doped region 112 is heavily doped n-type silicon. In a most preferred embodiment, heavily doped region 112 is deposited and doped with an n-type dopant such as phosphorus by any conventional method, preferably by in situ doping. This layer is preferably between about 200 and about 800 angstroms.

Next the silicon that will form the remainder of the diode is deposited by any method known in the art. In a preferred embodiment top heavily doped p-type region 116 will be formed by ion implantation. The thickness to be deposited in this step, then, will be the final desired thickness of intrinsic region 114 plus the desired thickness of top heavily doped region 116 after implantation. In the finished device, intrinsic region 114 is preferably between about 600 and about 2000 angstroms, for example about 1600 angstroms. Heavily doped p-type region 116 is between about 100 and about 1000 angstroms, preferably about 400 angstroms. (Some thickness, for example about 200 angstroms, of layer 116 will be consumed during silicide formation in a later step; thus the thickness of layer 116 may be selected to allow for this anticipated loss.) The thickness to be deposited undoped in this step, then, is between about 700 and about 3000 angstrom, preferably about 2000 angstroms.

It is preferred that the diodes to be formed be low-leakage p-i-n diodes. Leakage is minimized in such a diode by maximizing the thickness of the intrinsic region. Herner et al., U.S. patent application Ser. No. 11/215,951, "Ultrathin Chemically Grown Oxide Film as a Dopant Diffusion Barrier in Semiconductor Devices," filed Aug. 31, 2005 and hereby incorporated by reference, describes use of a chemically grown oxide between heavily doped region 112 and intrinsic region 114, while Kumar et al., U.S. patent application Ser. No. 11/271,078, "Vertical Diode Doped With Antimony to Avoid or Limit Dopant Diffusion," filed Nov. 10, 2005, owned by the assignee of the present invention and hereby incorporated by reference, describes doping heavily doped region 112 with antimony; both methods serve to prevent or limit diffusion of dopant from heavily doped region 112 into intrinsic region 114. Diffusion of dopant into the intrinsic region decreases its thickness and increases leakage; thus these methods to limit dopant diffusion may advantageously be used in embodiments of the present invention to form a low-leakage diode.

Top heavily doped regions 116 are formed at this point by ion implantation with a p-type dopant, for example boron or $BF_2$. The diode described herein has a bottom n-type region and a top p-type region. If preferred, the conductivity types could be reversed.

When deposited by conventional methods, silicon regions 112, 114, and 116 will be amorphous at this point, and will be crystallized in a later step. As described earlier and in the '530 application, if these layers are crystallized adjacent to a layer of a silicide, for example titanium silicide, the resulting polysilicon will be low in defects and relatively low-resistivity, providing a diode that will provide relatively high current without first requiring application of a large programming voltage.

In preferred embodiments, the next layer deposited is layer 120 of titanium, which may be between about 30 and about 200 angstroms thick, preferably about 100 angstroms thick. Capping this is layer 122 of titanium nitride, which may be about 100 angstroms thick. In a later step an anneal, for example a rapid thermal anneal will be performed. This anneal will cause titanium layer 120 to react with the silicon of layer 116 to form titanium silicide (not shown) and will crystallize silicon layers 112, 114, and 116. During crystallization the silicon will be adjacent to a layer of titanium silicide, causing the resulting polysilicon to be low-resistivity.

A layer 118 of a metal oxide or nitride resistivity-switching material including a metal additive is formed on layer 122. This layer is preferably between about 50 and about 600 angstroms, preferably about 400 angstroms. Layer 118 can be any of the materials described earlier, and is preferably formed of a metal oxide or nitride compound having including exactly one metal which exhibits resistance switching behavior; preferably a material selected from the group consisting of $NiO$, $Nb_2O_5$, $TiO_2$, $HfO_2$, $Al_2O_3$, $CoO$, $MgO_x$, $CrO_2$, $VO$, $BN$, and $AlN$. The added metal is preferably cobalt, aluminum, gallium, indium, manganese, nickel, niobium, zirconium, titanium, hafnium, tantalum, magnesium, chromium, vanadium, boron, yttrium, or lanthanum. For simplicity this discussion will describe the use of NiO with added cobalt in layer 118, though it will be understood that other materials may be used. In preferred embodiments NiO layer 118 with added cobalt is formed by reactive sputtering, in which the sputtering target is at least 95 at % nickel and between 0.01 and 5 at % cobalt, for example between about 1 and about 2 at % cobalt.

Finally in preferred embodiments barrier layer 124 is deposited on NiO layer 118. Layer 124 is preferably titanium nitride, though some other appropriate conductive barrier material may be used instead. An upcoming CMP step will be performed on layer 124, so it is preferably relatively thick, about 800 angstroms.

Returning to FIG. 4*b*, at this stage layers 124, 118, 122, and 120, which will make up the resistance-switching state-change element, and silicon regions 116, 114, and 112, which will form the diode, will be patterned and etched to form pillars 300. Pillars 300 should have about the same pitch and about the same width as conductors 200 below, such that each pillar 300 is formed on top of a conductor 200. Some misalignment can be tolerated.

Pillars 300 can be formed using any suitable masking and etching process. The stack to be etched is relatively tall and includes materials which require the use of different etchants. Preferably, then, photoresist is deposited, patterned using standard photolithography techniques, then titanium nitride layer 124, NiO layer 118, titanium nitride layer 122, and titanium layer 120 are etched. An advantageous method to etch transition metal oxides, such as those of many preferred materials for resistivity-switching layer 118, is described in Raghuram et al., U.S. patent application Ser. No. 11/179,423, "Method of Plasma Etching Transition Metals and Their Compounds," filed Jul. 11, 2005 and hereby incorporated by reference. These etched layers can then act as a hard mask during etch of the remaining layers.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between pillars 300, filling the gaps between them. Dielectric material 108 can be any known electrically insulating material, such as silicon oxide, silicon nitride, or silicon oxynitride. In a preferred embodiment, silicon dioxide is used as the insulating material. The silicon dioxide can be deposited using any known process, such as CVD or HDPCVD.

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used. The resulting structure is shown in FIG. 4*b*.

In this example, layers 124, 118, 122, and 120 were patterned in a single patterning step with silicon regions 112 and 114 and 116, followed by a multi-step etch. In some embodiments, however, it may be desirable to form the diode and the state-change element in separate patterning steps to reduce etch height and to avoid possible contamination by having NiO and metal barrier layers exposed in a chamber devoted to semiconductor etch. In this process (not shown), silicon regions 112 and 114 are deposited, patterned and etched to form pillars. Dielectric fill is deposited to fill gaps between the pillars, and a CMP step removes overfill and exposes the tops of the pillars at a substantially planar surface. Top heavily doped regions 116 are formed by ion implantation. Titanium layer 120, titanium nitride layer 122, NiO layer 118, and titanium layer 124 are deposited on this planar surface, then patterned and etched in a separate step to form short pillars aligned with the diode pillars below. Some misalignment may be tolerated. Dielectric fill is deposited between the short pillars, and a CMP step removes overfill and exposes the tops of the pillars.

In other alternative embodiments, barrier layer 122, NiO layer 118 with added cobalt, and barrier layer 124 can be formed before (and therefore beneath) diode layers 112, 114, and 116, and may be patterned in the same or in a separate patterning step. In this case, the first layer of top conductors above the pillars will be a titanium layer capped with titanium nitride. During a later anneal this titanium will react with the silicon at the top of the diode to form titanium silicide, providing a crystallization template to form a low-defect polycrystalline diode.

In still other embodiments, contact layers of NiO with no added cobalt could be formed directly above or below NiO layer 118 (which has added cobalt) to provide improved electrical contact for NiO layer 118.

Figure 4C:
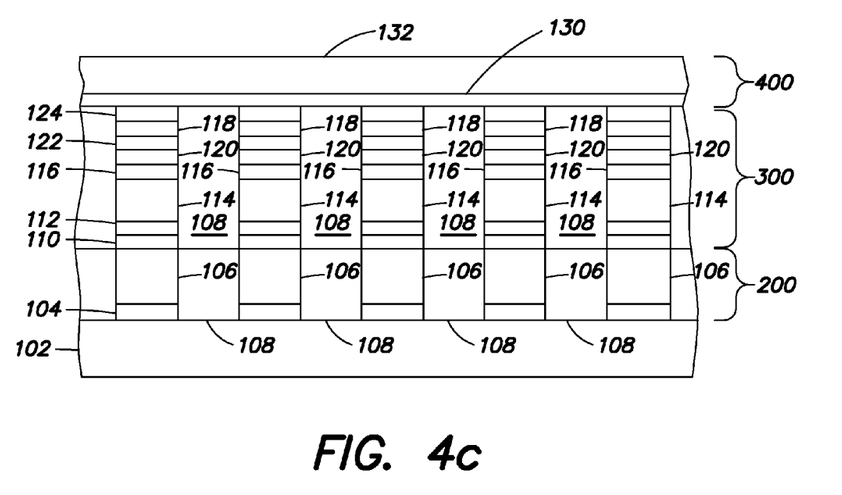

Turning to FIG. 4*c*, after formation of pillars 300 is complete, a conductive material or stack is deposited to form the top conductors 400. In a preferred embodiment, titanium nitride barrier layer 130 is deposited next, followed by tungsten layer 132. Top conductors 400 can be patterned and etched as described earlier. In this example in each cell the diode (of layers 112, 114, and 116) and a state-change element (comprising resistance-switching layer 118) have been formed in series between top conductor 400 and bottom conductor 200. Overlying second conductors 400 will preferably extend in a different direction from first conductors 200, preferably substantially perpendicular to them. The resulting structure, shown in FIG. 4*c*, is a bottom or first level of memory cells.

In each memory cell in this memory level, layers 122, 118, and 124, and contact layers if they are included, will behave as a reversible state-change element. During normal operation of the device, the reversible state-change element is changed from a first resistance state to a second resistance state and back. The difference in resistance between the first resistance state and the second resistance state may be at least a factor of five.

Additional memory levels can be formed above this first memory level. In some embodiments, conductors can be shared between memory levels; i.e. top conductor 400 would serve as the bottom conductor of the next memory level. In other embodiments, an interlevel dielectric is formed above the first memory level of FIG. 4*c*, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Biasing of Array Lines for Set and Reset

As noted, some of the resistivity-switching metal oxides or nitrides, in some environments, require that the set current flows in one direction while the reset current flows in the opposite direction, while in others the direction of current flow is unimportant.

Suppose, in a memory array like that of FIG. 4c, the diode must be biased in the forward direction to convert resistivity-switching layer 118 from the high-resistivity state to the low-resistivity state (a forward set current is required), while the diode must be biased in the reverse direction to convert resistivity-switching layer 118 from the low-resistivity state to the high-resistivity state (a reverse reset current is required.)

Figure 5:
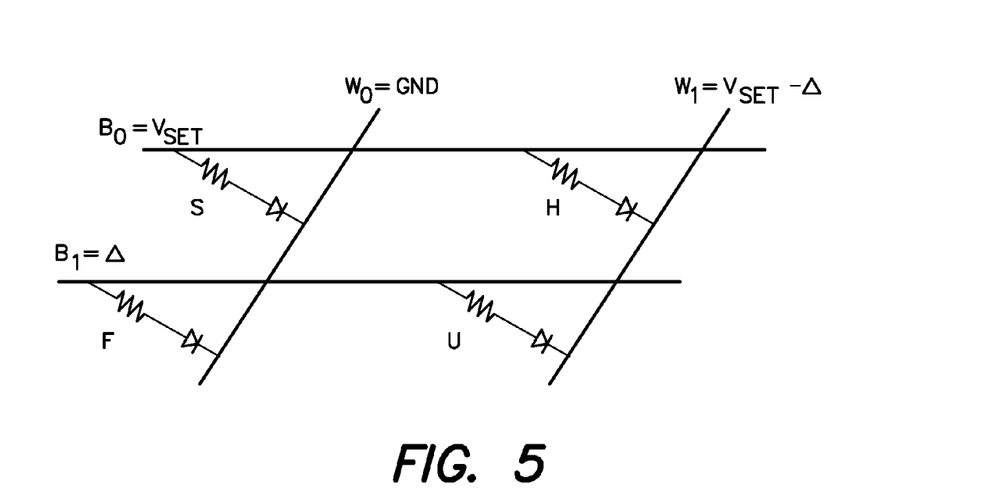
FIG. 5 is a circuit diagram illustrating an advantageous biasing scheme that may be used to set a selected cell formed according to the present invention without disturbing neighboring cells.

A cell must be put in the low-resistivity state without inadvertently switching neighboring cells which share top or bottom conductors. Turning to FIG. 5, to switch selected cell S from the high-resistance state to the low-resistance state, interconnect line $B_0$ is set to set voltage $V_{SET}$, and interconnect line $W_0$ is set to ground, applying $V_{SET}$ across selected cell S. To avoid switching other cells in the array, unselected interconnect line $B_1$ is set to $\Delta$ and interconnect line $W_1$ is set to $V_{SET}-\Delta$.

For example, suppose $V_{SET}$ is 10 volts and $\Delta$ is 5 volts. A set voltage of 10 volts is applied across selected cell S, causing it to switch. A forward voltage of 5 volts is applied to both half-selected cells H (between interconnect line $B_0$ and interconnect line $W_1$) and F (between interconnect line $B_1$ and interconnect line $W_0$), a voltage too low to cause switching. For the $V_{SET}$ and $\Delta$ values selected, no voltage is applied across unselected cell U.

Clearly the value for $\Delta$ can be assigned within a range. The value for $\Delta$ should be selected so that none of the H, F, or U cells is subjected to voltage or current large enough to cause set or reset. Unselected cell U is subjected to a voltage of $\Delta-(V_{SET}-\Delta)$, or $2\Delta-V_{SET}$. In general, then, to avoid unintentional reset of unselected cell U:

$$|2\Delta-V_{SET}|<|V_{RESET}|$$

In a typical array, a large majority of cells in the array correspond to unselected cell U. Thus, to minimize leakage current, it is advantageous to minimize voltage applied across unselected cell U. In the present example this was done by selecting $\Delta=V_{SET}/2$, which guarantees that no voltage will be applied or current will flow across unselected cell U.

Figure 6:
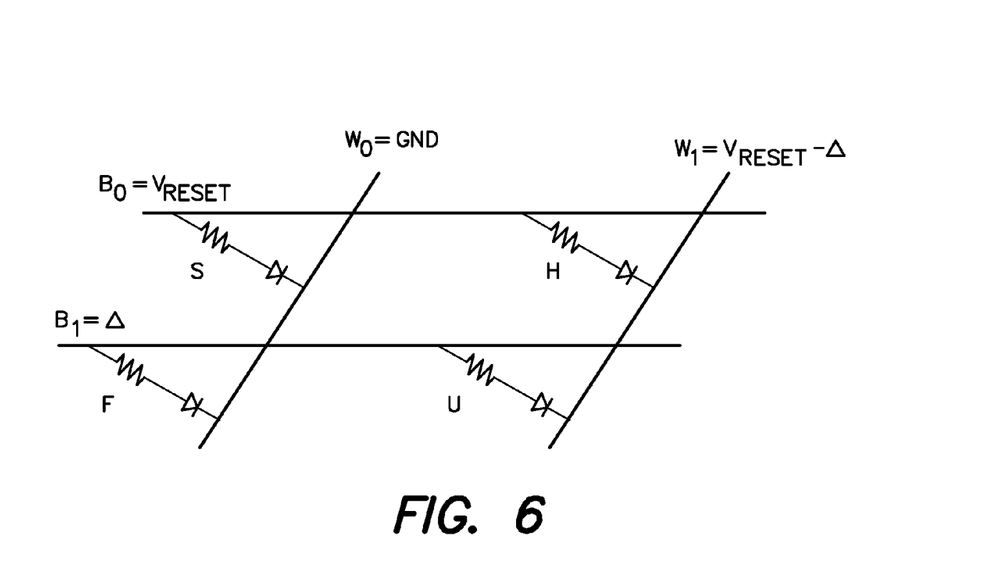
FIG. 6 is a circuit diagram illustrating an advantageous biasing scheme that may be used to reset a selected cell formed according to the present invention without disturbing neighboring cells.

Turning to FIG. 6, to switch selected cell S from the low-resistance state to the high-resistance state, a reset voltage is applied, which, in this example, must be a negative voltage. Interconnect line $B_0$ is set to reset voltage $V_{RESET}$, and interconnect line $W_0$ is set to ground, applying $V_{RESET}$ across selected cell S. To avoid switching other cells in the array, unselected interconnect line $B_1$ is set to $\Delta$ and unselected interconnect line $W_1$ is set to $V_{RESET}-\Delta$.

As in the prior example, it is advantageous to minimize voltage and current across unselected cell U, which is done by selecting $\Delta=V_{RESET}/2$. For example, suppose $V_{RESET}$ is $-10$ volts. A reset voltage of $-10$ volts is applied across selected cell S, causing it to switch. A voltage of $-5$ volts is applied to both half-selected cells H (between interconnect line $B_0$ and interconnect line $W_1$) and F (between interconnect line $B_1$ and interconnect line $W_0$), a voltage too low to cause switching. No voltage is applied across unselected cell U.

As above, the value for $\Delta$ can fall within a range, for example such that:

$$|2\Delta-V_{RESET}|<|V_{SET}|$$

These set and reset voltages, and selected values for $\Delta$, are examples for illustration only. Many values could be selected. It is routine to select optimal programming voltages and currents based on the characteristics of the memory cells.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A semiconductor device comprising:
    a reversible state-change element comprising a layer distinct from a substrate of the device, the layer comprising:
        a resistivity-switching metal nitride binary compound, the resistivity-switching metal nitride binary compound including only one metal, wherein resistance-switching of the reversible state-change element correlates to resistivity-switching of the resistivity-switching metal nitride compound, and
        a metal additive,
    wherein the metal additive comprises a dopant in the layer, and
    wherein the metal additive comprises between about 0.01 and about 5 percent of the metal atoms in the layer.

2. The semiconductor device of claim 1 wherein the resistivity-switching metal nitride compound is selected from the group consisting of BN, and AlN.

3. The semiconductor device of claim 1 wherein the metal additive is selected from the group consisting of cobalt, aluminum, gallium, indium, manganese, nickel, niobium, zirconium, titanium, hafnium, tantalum, magnesium, chromium, vanadium, boron, yttrium, and lanthanum.

4. A semiconductor device comprising:
    a reversible state-change element comprising a layer of the device, the layer comprising:
        a resistivity-switching metal oxide or nitride binary compound, the resistivity-switching metal oxide or nitride binary compound including only one metal, and
        a metal additive,
    wherein the metal additive comprises a dopant in the layer;
    wherein the metal additive comprises between about 0.01 and about 5 percent of the metal atoms in the layer; and
    wherein the resistivity-switching metal oxide or nitride compound is NiO and the metal additive is aluminum.

5. The semiconductor device of claim 1 wherein the metal additive is introduced by ion implantation.

6. The semiconductor device of claim 1 wherein the metal additive is introduced by diffusion.

7. The semiconductor device of claim 1 wherein the metal additive is introduced by sputtering.

8. The semiconductor device of claim 1 wherein the device comprises a nonvolatile memory cell.

9. The semiconductor device of claim 1 wherein, during normal operation of the device, the reversible state-change element is changed from a first resistance state to a second resistance state, the first resistance state different from the second resistance state.

10. The semiconductor device of claim 9 wherein the difference between the first resistance state and the second resistance state is at least a factor of five.

11. The semiconductor device of claim 9 wherein the reversible state-change element is changed from a first resistance state to a second resistance state by flow of a set current or reset current through, or application of a set voltage or reset voltage across, the state-change element.

12. A rewriteable nonvolatile memory cell comprising:
a state-change element comprising a layer distinct from a substrate of the memory cell, the layer comprising:
a resistivity-switching metal nitride binary compound, the resistivity-switching metal nitride binary compound including only one metal, wherein resistance-switching of the reversible state-change element correlates to resistivity-switching of the resistivity-switching metal nitride compound, and
a metal additive,
wherein the metal additive comprises a dopant in the layer, and
wherein the metal additive comprises between about 0.01 and about 5 percent of the metal atoms in the layer,
wherein a data state of the memory cell is stored in a resistivity state of the layer.

13. The rewriteable nonvolatile memory cell of claim 12 wherein the memory cell is formed above the substrate.

14. The rewriteable nonvolatile memory cell of claim 13 further comprising a diode, the diode and the state-change element electrically in series between a first conductor and a second conductor.

15. The rewriteable nonvolatile memory cell of claim 14 wherein the second conductor is above the first conductor, the first conductor above the substrate, and wherein the diode and the state-change element are vertically disposed between the first conductor and the second conductor.

16. The rewriteable nonvolatile memory cell of claim 14 wherein the diode is a semiconductor junction diode.

17. The rewriteable nonvolatile memory cell of claim 12 wherein the resistivity-switching metal nitride compound is selected from the group consisting of BN, and AlN.

18. The rewriteable nonvolatile memory cell of claim 12 wherein the metal additive is selected from the group consisting of cobalt, aluminum, gallium, indium, manganese, nickel, niobium, zirconium, titanium, hafnium, tantalum, magnesium, chromium, vanadium, boron, yttrium, and lanthanum.

19. A monolithic three dimensional memory array comprising:
a) a first memory level formed above a substrate, the first memory level comprising:
a plurality of first reversible state-change elements, each state-change element comprising a layer distinct from the substrate, the layer comprising:
a resistivity-switching metal nitride binary compound, the resistivity-switching metal nitride binary compound including only one metal, and
a metal additive,
wherein the metal additive comprises a dopant in the layer, and wherein the metal additive comprises between about 0.01 and about 5 percent of the metal atoms in the layer; and
b) a second memory level monolithically formed above the first memory level.

20. The monolithic three dimensional memory array of claim 19 wherein the resistivity-switching metal oxide or nitride compound is selected from the group consisting of NiO, $Nb_2O_5$, $TiO_2$, $HfO_2$, $Al_2O_3$, CoO, $MgO_x$, $CrO_2$, VO, BN, and AlN.

21. A semiconductor device comprising:
a reversible state-change element comprising a layer distinct from a substrate of the device, the layer comprising:
a resistivity-switching metal oxide or nitride binary compound, the resistivity-switching metal oxide or nitride binary compound including only one metal, and
a metal additive selected from the group consisting of aluminum, gallium, indium, and boron,
wherein the metal additive comprises a dopant in the layer, and
wherein the metal additive comprises between about 0.01 and about 5 percent of the metal atoms in the layer.

22. The semiconductor device of claim 21 wherein the resistivity-switching metal oxide or nitride compound is selected from the group consisting of NiO, $Nb_2O_5$, $TiO_2$, $HfO_2$, $Al_2O_3$, CoO, $MgO_x$, $CrO_2$, VO, BN, and AlN.

23. The semiconductor device of claim 21 wherein the metal additive is introduced by ion implantation.

24. The semiconductor device of claim 21 wherein the metal additive is introduced by diffusion.

25. The semiconductor device of claim 21 wherein the metal additive is introduced by sputtering.

26. The semiconductor device of claim 21 wherein the device comprises a nonvolatile memory cell.

27. The semiconductor device of claim 21 wherein, during normal operation of the device, the reversible state-change element is changed from a first resistance state to a second resistance state, the first resistance state different from the second resistance state.

28. The semiconductor device of claim 27 wherein the difference between the first resistance state and the second resistance state is at least a factor of five.

29. The semiconductor device of claim 27 wherein the reversible state-change element is changed from a first resistance state to a second resistance state by flow of a set current or reset current through, or application of a set voltage or reset voltage across, the state-change element.

30. A rewriteable nonvolatile memory cell comprising:
a state-change element comprising a layer distinct from a substrate of the memory cell, the layer comprising:
a resistivity-switching metal oxide or nitride binary compound, the resistivity-switching metal oxide or nitride binary compound including only one metal, and
a metal additive selected from the group consisting of aluminum, gallium, indium, and boron,
wherein the metal additive comprises a dopant in the layer, and
wherein the metal additive comprises between about 0.01 and about 5 percent of the metal atoms in the layer,
wherein a data state of the memory cell is stored in a resistivity state of the layer.

31. The rewriteable nonvolatile memory cell of claim 30 wherein the memory cell is formed above the substrate.

32. The rewriteable nonvolatile memory cell of claim 31 further comprising a diode, the diode and the state-change element electrically in series between a first conductor and a second conductor.

33. The rewriteable nonvolatile memory cell of claim 32 wherein the second conductor is above the first conductor, the first conductor above the substrate, and wherein the diode and the state-change element are vertically disposed between the first conductor and the second conductor.

34. The rewriteable nonvolatile memory cell of claim 32 wherein the diode is a semiconductor junction diode.

35. The rewriteable nonvolatile memory cell of claim 30 wherein the resistivity-switching metal oxide or nitride compound is selected from the group consisting of NiO, $Nb_2O_5$, $TiO_2$, $HfO_2$, $Al_2O_3$, CoO, $MgO_x$, $CrO_2$, VO, BN, and AlN.

* * * * *